Sept. 21, 1965 H. L. MILLER 3,207,959

MINIATURIZED AND TRANSISTORIZED FREQUENCY SELECTIVE AMPLIFIER CIRCUIT

Filed Dec. 8, 1961

INVENTOR
H.L.MILLER

By A. J. Nugent
ATTORNEY 3,207,959
Patented Sept. 21, 1965

3,207,959

MINIATURIZED AND TRANSISTORIZED FREQUENCY SELECTIVE AMPLIFIER CIRCUIT

Harry L. Miller, Oceanport, N.J., assignor to Western Electric Company, Incorporated, a corporation of New York Filed Dec. 8, 1961, Ser. No. 157,939
3 Claims. (Cl. 317—147)

Figures 1, 2:
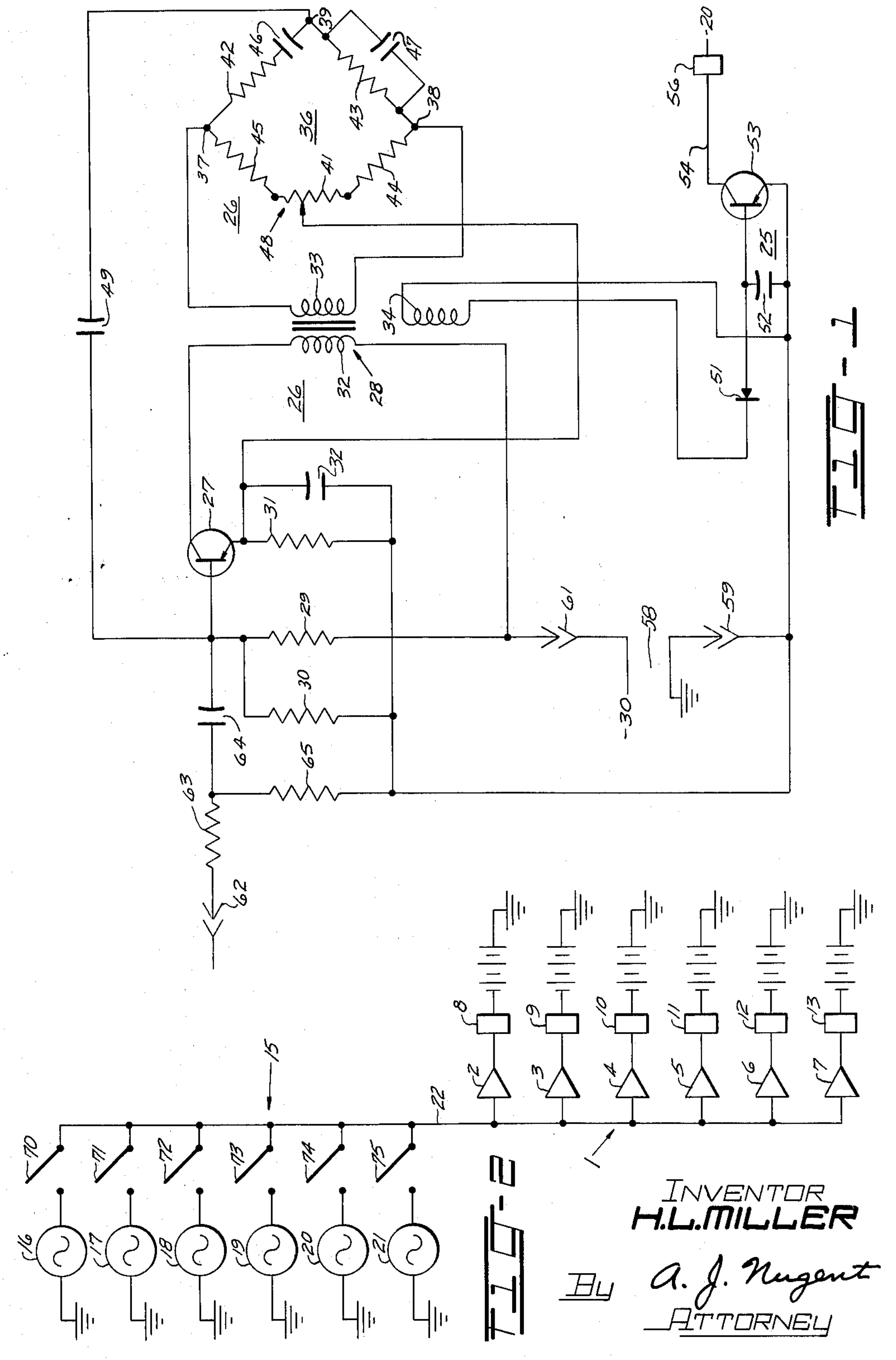

This invention relates to an apparatus for receiving and selectively amplifying electrical signals and has for an object the provision of one or more frequency selective amplifier circuits each tuned to a different one of a plurality of predetermined frequencies and operable to activate an associated electromechanical or electrical device upon receipt by the circuit of an electrical signal containing the frequency to which the circuit is tuned.

Another object of the invention is the provision of a stable frequency selective amplifier circuit of reduced complexity, cost, and size which requires only resistance and capacitance components in the frequency selective portion thereof to thus eliminate the need for relatively large and costly inductive apparatus for the filtering of unwanted frequencies and adapt the circuit for use in situations wherein space considerations are of great significance.

A further object of the invention is the provision of a frequency selective amplifier circuit for use in test set multi-frequency receivers which are specifically designed for permanent incorporation in cross bar switching equipment of the nature disclosed in U.S. Patent 2,585,904 to A. J. Busch.

In a preferred embodiment herein-disclosed, the invention comprises a miniaturized, and transistorized, frequency selective amplifier circuit tunable to any one of a plurality of predetermined frequencies and operative, upon the application thereto of an electrical signal containing the frequency to which the circuit is tuned, to operate an associated relay or solid state device. The circuit generally includes an amplifying means operative to amplify incoming signals to the predetermined extent necessary to effect operation of the associated relay or solid state device, a testing means connected thereto and operative to reduce amplification of the signals by the amplifying means below the predetermined extent if the electrical signal does not contain the frequency to which the circuit is tuned, and a detecting means operatively coupled to the amplifying means and effective to operate the associated relay or solid state device.

The details and the above and other objects and advantages of the invention are believed made clear by detailed reference to the accompanying drawings, wherein:

FIG. 1 is a circuit diagram of the frequency selective amplifier circuit of the invention; and, FIG. 2 is a schematic diagram of a multi-frequency receiver utilizing six of the frequency selective amplifier circuits of the invention and depicted in conjunction with a supply source of multi-frequency current signals connected thereto.

Turning now to FIG. 1, the frequency selective amplifier circuit is seen to include a transistorized amplifier circuit, indicated generally at 26, a transistorized detector circuit 25 transformer coupled thereto, and a relay circuit 54 connected to the detector circuit.

The transistorized amplifier circuit 26 is seen to include a PNP transistor 27 connected as a common-emitter amplifier with resistors 29 and 30 functioning as a voltage divider for biasing the transistor for class A operation, emitter-resistor 31 functioning to limit the transistor collector-emitter current, and capacitor 32 to provide an A.C. by-pass around emitter-resistor 31.

Resistors 63 and 65 and D.C. blocking capacitor 64, the capacitive reactance of which varies inversely with the signal frequency to which the circuit is tuned, are connected to the base of the transistor in the manner shown and function to de-couple the circuit from other circuits of the same type which may be connected in parallel therewith and to maintain a proper voltage level at the input to the transistor.

Further included in the transistorized amplifier circuit are transformer 28 comprising primary, secondary, and tertiary windings 32, 33, and 34, respectively, and Wien bridge 36 with apexes 37, 38, 39, and 41. Resistors 42, 43, 44, and 45; tuning capacitors 46 and 47; and potentiometer 48 are connected in the bridge in the manner shown; with the capacitance values of the tuning capacitors being equal, and determinative of the frequency to which the bridge is tuned in accordance with the formula equating such frequency to approximately $1/2\pi RC$ wherein C is the capacitance value of such capacitors and R the resistance value of equal value resistors 42 and 43. Potentiometer 48 is utilized to establish the value of the ratio $R45/R44$ at slightly less than 2 to prevent oscillation of the circuit while insuring maximum frequency selectivity thereof.

Apexes 39 and 41 of the bridge are connected across the base and emitter of transistor 27 in the manner shown to provide a negative feedback path from the bridge to the transistor, with bridge apexes 37 and 38 being connected across the transformer secondary 33 in the manner shown to provide a path for the coupling of the transistor amplified signals to the bridge. D.C. blocking capacitor 49 is included in the negative feedback path to block any D.C. current that may tend to flow between the base of the transistor and the bridge components.

The detector circuit 25 is coupled to the amplifier circuit through tertiary winding 34 of the transformer and includes a PNP switching transistor 53, with germanium diode rectifier 51, and electrolytic capacitor 52 connected to the base thereof in the manner shown. A relay circuit, generally indicated at 54 is associated with transistor 53 and includes relay 56 and a negative 20 volt power supply with the positive side thereof grounded. One winding terminal of the relay is seen to be connected to the collector of transistor 53 and to ground through the emitter when the transistor is activated, with the other such terminal being connected in series with a 20 volt battery.

The operating current for the common-emitter amplifier transistor 27 is provided by a negative 30 volt power supply 58 with the positive side thereof grounded, with plug-in contact 61 functioning to connect the circuit thereto. Plug-in contact 62 functions to connect the circuit to a source of current signals.

Turning now to FIG. 2, a multi-frequency receiver, illustrative of but one of the manners in which the circuit of the invention may be utilized, is indicated generally at 1 and is seen to comprise six of the frequency selective amplifier circuits of the invention, illustrated schematically at 2 through 7. The circuits are connected to associated relays 8 through 13 and a source of multi-frequency current signals, line 22, in the manner shown.

A multi-frequency current supply, which is indicated generally at 15 and seen to comprise six oscillator circuits, 16 through 21, connectible to line 22 and the receiver circuits, through switches 70 to 75. Six basic frequencies within the audio range are employed in this application of the invention with each of the oscillator circuits set to generate a different one of the basic frequencies and each of the receiver circuits tuned to operate, in the manner set forth in detail herein-below, the relay associated therewith upon application thereto of signals of a different one of the basic frequencies.

In operation, upon the application of a current signal to the frequency selective amplifier circuit of FIG. 1, the signal is applied to the base of transistor 27, initially amplified thereby to the predetermined extent necessary to effect operation of associated relay 56, and applied through the secondary and tertiary windings of the transformer 28 to apexes 37 and 38 of bridge 36, and detector circuit 25, respectively. If the frequency of the thusly applied amplified signal is the frequency to which the bridge is tuned, no voltage is developed across bridge apexes 39 and 41 and thus no negative feedback is applied at the base of transistor 27. Accordingly, amplification of the signal by the transistor to the predetermined extent and application of the thusly amplified signal to the detector circuit 25 continues for the duration of the signal, with germanium diode 51 functioning to rectify the signal in the detector circuit to apply a negative bias to the base of switching transistor 53 for a duration sufficient to drive the transistor to saturation and allow conduction between the collector and emitter thereof. This completes a circuit to ground through the winding of relay 56 to enable operation of the relay by power supplied thereto from the negative 20 volt power supply. Electrolytic capacitor 52 charges up on intermittent peaks of the D.C. current which result from the half-wave rectification of the amplified A.C. current signal by germanium diode rectifier 51, thus functioning to hold a negative bias on switching transistor 53 for the duration of the signal.

In general, the signal duration utilized in a typical application of the invention is approximately 50 milliseconds, which duration has proven sufficient to effect operation of the relay by completing an operating path therefor to ground in relay circuit 54 through switching transistor 53 if, as is set forth above, the frequency of the signal applied to the circuit is that to which the circuit is tuned.

In the event that the frequency of the signal applied to the circuit is not the frequency to which the circuit is tuned, the signal is nonetheless initially amplified by transistor 27 to the predetermined extent and applied, through the transformer secondary and tertiary, to apexes 37 and 38 of the bridge and detector circuit 25, respectively. It is to be noted, however, that such application of the initially amplified signal to the detector circuit is of insufficient duration—constituting merely a surge therethrough for a maximum of 2 milliseconds—to effect conduction between the collector and emitter of switching transistor 53 and attendant operation of relay 56. In the meantime, the simultaneous application of the signal to apexes 37 and 38 of the bridge results in a voltage being developed across bridge apexes 39 and 41 since the frequency of the signal is not that to which the bridge is tuned. Such voltage is applied, through the feedback path, to the base of the transistor 27 as negative feedback out of phase with the applied signal, thus cutting down the gain of the transistor to the extent that further amplification of the applied signal thereby to the predetermined extent and continued application thereof to the detector circuit for a duration sufficient to effect operation of the relay, is prevented. It is to be noted, however, that the circuit of the invention will function equally as well upon the application thereto of a multi-frequency signal containing the frequency to which the circuit is tuned in that the negative feedback resulting from the application of the frequencies contained in the signal which do not correspond with the frequency to which the circuit is tuned will reduce the gain of the transistor only at those frequencies and will not prevent continued amplification by the transistor to the predetermined extent at the frequency to which the circuit is tuned. Thus, the invention is seen to provide a frequency selective amplifier circuit tunable to any one of a wide variety of predetermined frequencies and operable to activate an associated relay only upon receipt by the circuit of an electrical signal containing the frequency to which the circuit is tuned. Further, it is made clear that the circuit functions as above while requiring only resistance and capacitance components in the frequency selective portion thereof.

The system application of the invention depicted in FIG. 2 operates in the following manner. Each of the six oscillators, 16 through 21, is set to generate a current signal at a different predetermined frequency. For example, oscillator 16 may be set to generate a current signal at 700 cycles, oscillator 17 to generate a current signal at 900 cycles, oscillator 18 at 1100 cycles, oscillator 19 at 1300 cycles, oscillator 20 at 1500 cycles, and oscillator 21 at 1700 cycles. The frequency selective amplifier circuits 2 through 7 are similarly tuned to operate the relays 8 through 13 associated therewith in response to current signals at these same freqeuncies with, for example, circuit 2 being tuned to operate the relay associated therewith in response to current signals at 700 cycles, circuit 3 in response to current signals at 900 cycles, circuit 4 at 1100 cycles, circuit 5 at 1300 cycles, circuit 6 at 1500 cycles, and circuit 7 at 1700 cycles.

It is thus made apparent that any desired combination of the relays associated with the frequency selective amplifier circuits of the receiver may be speedily and simultaneously activated by simultaneous short duration closing of the combination of switches associated with the corresponding—insofar as signal frequencies are concerned—oscillators. For example, should simultaneous activation of relays 9 and 13 be desired as in a two out of six code, switches 71 and 75 are simultaneously closed for a very short duration with the result that a multi-frequency current signal at 900 and 1700 cycles is applied to line 22 and hence to each of the six frequency selective amplifier circuits of the receiver. The application of this multi-frequency signal at 900 and 1700 cycles to circuits 3 and 7 will effect operation of relays 9 and 13 associated therein in the manner set forth in detail hereinabove, since the frequencies of the signal are the frequencies to which these particular circuits are tuned. However, the application of the 900 and 1700 cycle signal to the remaining circuits of the receiver, i.e., 2, 4, 5, and 6 will not effect the operation of the relays associated therewith because the frequencies of the signal do not correspond with the frequencies to which these remaining circuits have been tuned.

Various modifications of this invention will become apparent to those skilled in the art after reading this disclosure. It is, therefore, intended that the matter contained in the foregoing description and annexed drawings be interpreted as only illustrative, and not in a limiting sense, when consideration is given to the appended claims.

What is claimed is:

1. In a frequency selective amplifier circuit for amplifying signals applied thereto, a transformer including a plurality of windings, a transistor arranged as a common-emitter amplifier and connected across a first of said windings, a frequency selective bridge circuit including only resistance and capacitance components and tuned to a predetermined frequency, connected across a second of said windings and across the emitter and the base of the transistor, whereby signals applied to the base of the transistor are amplified to a predetermined extent and applied through the transformer to the bridge circuit wherein a voltage is developed and fed back to the base of the transistor as inverse feedback to reduce amplification of the signal by the transistor below the predetermined extent if the frequency of the signal does not correspond to the frequency to which the bridge is tuned, and a transistorized detector circuit connected across a third of said transformer windings for receiving amplified signals from the transistor.

2. In a circuit as in claim 1 further including a relay connected across the detector circuit and operable thereby.

3. In a circuit as in claim 1 further including a solid state device connected across the detector circuit and operable thereby.

References Cited by the Examiner

UNITED STATES PATENTS

| | | | |
|---|---|---|---|
| 2,173,426 | 9/39 | Scott | 330—109 X |
| 2,459,046 | 1/49 | Rieke | 330—109 |
| 2,590,310 | 3/52 | Hanchett | 330—109 X |
| 2,901,559 | 8/59 | Glazar | 330—101 X |
| 2,935,731 | 5/60 | Richter | 317—147 X |
| 3,039,081 | 6/62 | Smith | 317—138 X |
| 3,040,298 | 6/62 | Thomas et al. | 317—138 X |
| 3,041,507 | 6/62 | Rose et al. | 317—147 X |
| 3,078,444 | 2/63 | Druz et al. | 317—138 X |
| 3,095,542 | 6/63 | Fusfield et al. | 330—109 X |

SAMUEL BERNSTEIN, *Primary Examiner*.